(12) United States Patent
Bell

(10) Patent No.: US 6,643,559 B2
(45) Date of Patent: Nov. 4, 2003

(54) METHOD FOR MONITORING A SEMICONDUCTOR FABRICATION PROCESS FOR PROCESSING A SUBSTRATE

(75) Inventor: Ferdinand Bell, München (DE)

(73) Assignee: Infineon Technologies AG, Munich (DE)

(*) Notice: Subject to any disclaimer, the term of this patent is extended or adjusted under 35 U.S.C. 154(b) by 41 days.

(21) Appl. No.: 10/074,823

(22) Filed: Feb. 12, 2002

(65) Prior Publication Data

US 2002/0119668 A1 Aug. 29, 2002

Related U.S. Application Data

(63) Continuation of application No. PCT/DE99/02526, filed on Aug. 12, 1999.

(51) Int. Cl.[7] .............................................. G06F 19/00
(52) U.S. Cl. ....................... 700/121; 438/9; 204/192.33
(58) Field of Search ..................... 700/121; 204/192.33, 204/192.13; 438/9, 16; 356/72; 316; 216/59, 60, 67

(56) References Cited

U.S. PATENT DOCUMENTS

| | | | | |
|---|---|---|---|---|
| 4,312,732 A | * | 1/1982 | Degenkolb et al. .... | 204/192.33 |
| 4,493,745 A | * | 1/1985 | Chen et al. ................. | 438/9 |
| 5,160,576 A | * | 11/1992 | Robbins ...................... | 216/60 |
| 5,343,412 A | * | 8/1994 | Birang ......................... | 356/72 |
| 5,405,488 A | * | 4/1995 | Dimitrelis et al. ............ | 216/60 |
| 5,658,423 A | | 8/1997 | Angell et al. | |
| 5,737,496 A | | 4/1998 | Frye et al. | |
| 5,739,051 A | | 4/1998 | Saito | |
| 5,864,773 A | | 1/1999 | Barna et al. | |
| 5,877,032 A | * | 3/1999 | Guinn et al. .................... | 438/9 |
| 5,946,082 A | * | 8/1999 | Litvak et al. .................. | 356/72 |
| 6,207,008 B1 | * | 3/2001 | Kijima ......................... | 216/59 |
| 6,419,801 B1 | * | 7/2002 | Smith et al. ........... | 204/192.13 |

FOREIGN PATENT DOCUMENTS

| | | |
|---|---|---|
| EP | 0 566 218 A2 | 10/1993 |
| EP | 0 735 565 A1 | 10/1996 |

* cited by examiner

*Primary Examiner*—Leo Picard
*Assistant Examiner*—Alexander Kosowski
(74) *Attorney, Agent, or Firm*—Laurence A. Greenberg; Werner H. Stemer; Ralph E. Locher

(57) ABSTRACT

The invention relates to a method for monitoring a production process, whereby several models are used for detecting a finish point. The results of the model are subsequently compared with one another and the best model therefrom is used in other production processes to detect a finish point. The inventive method provides the advantage that process changes resulting from chamber contaminations or sensor drift are compensated for by selecting the best model, thereby ensuring reliable finish point detection even in case of unfavorable process conditions.

15 Claims, 9 Drawing Sheets

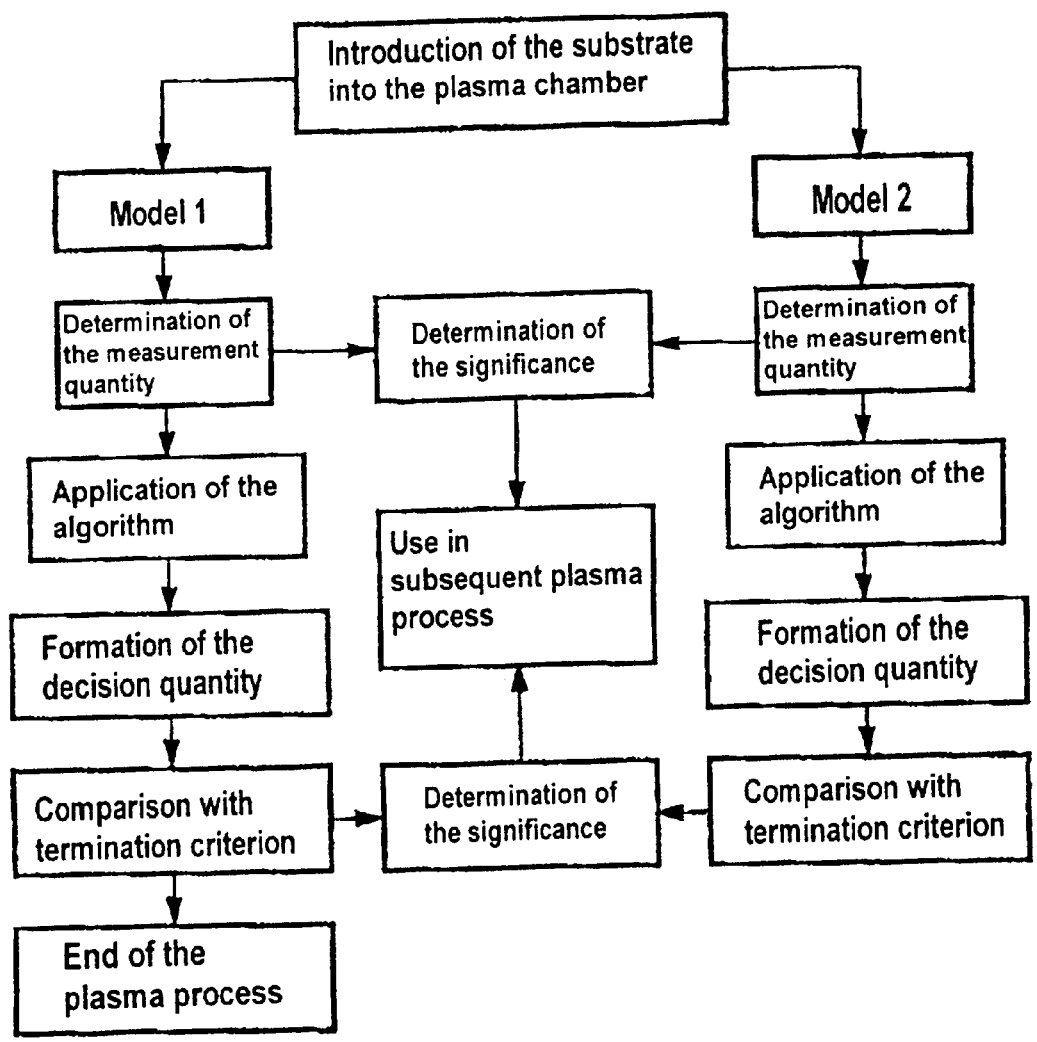

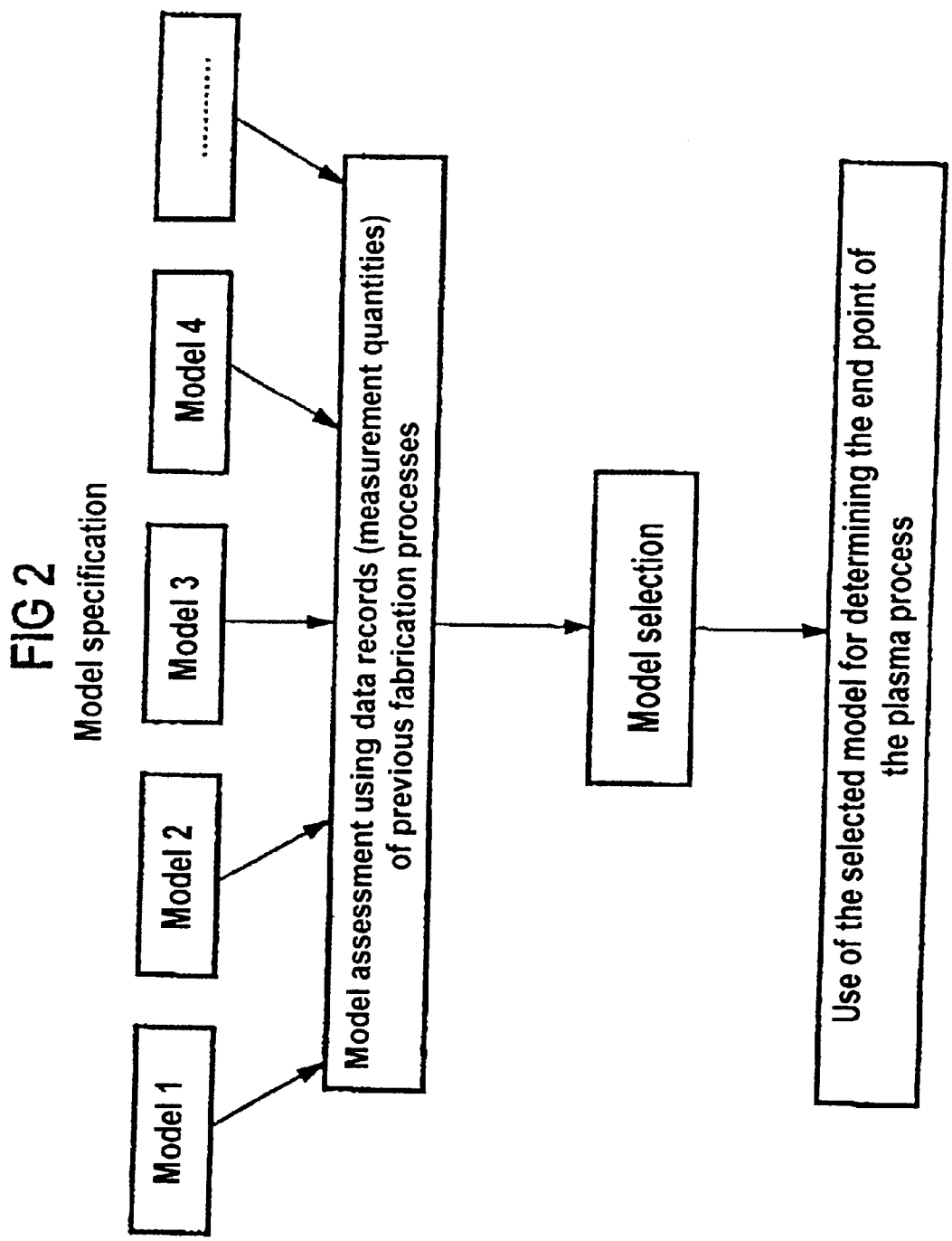

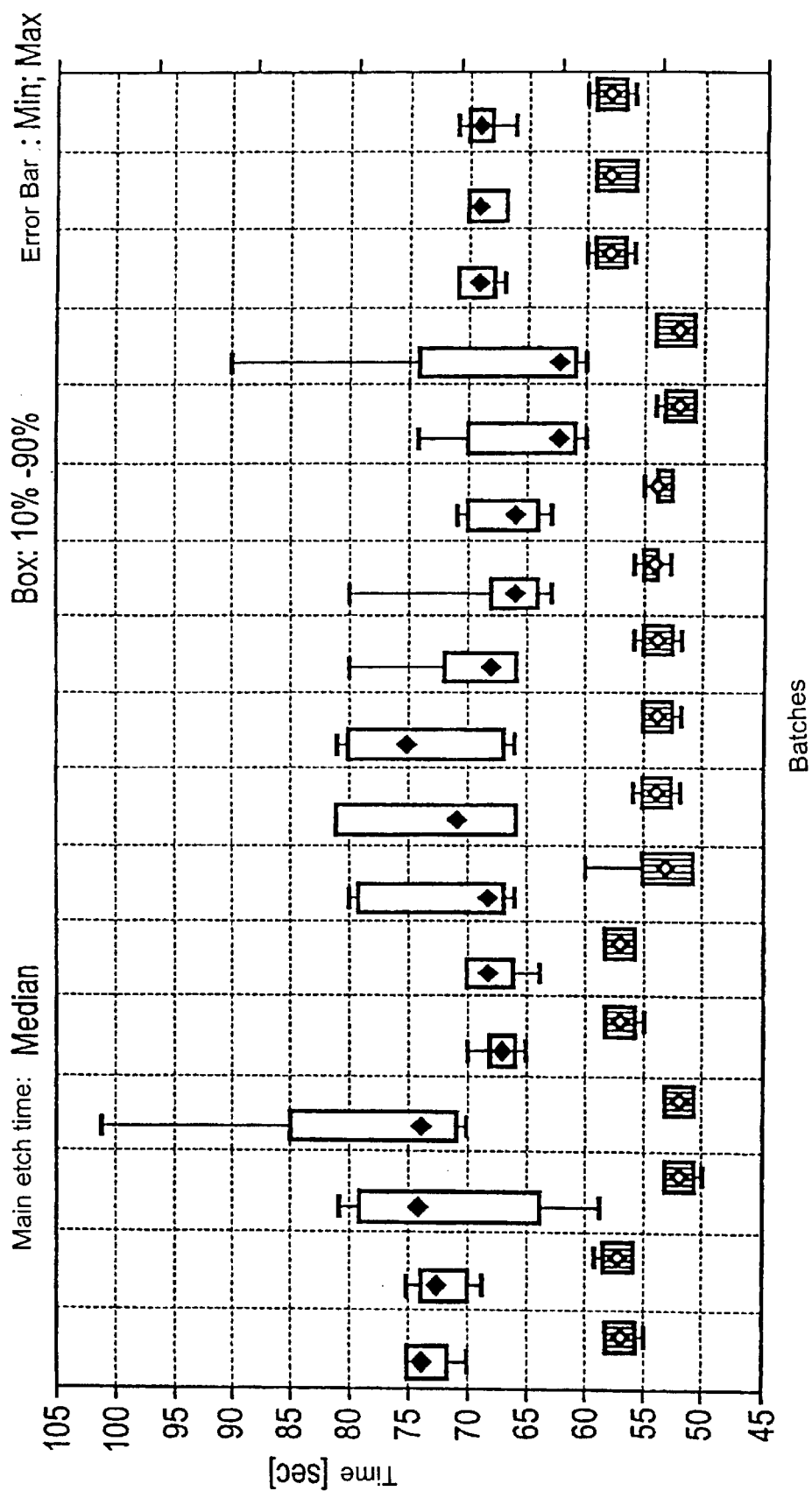

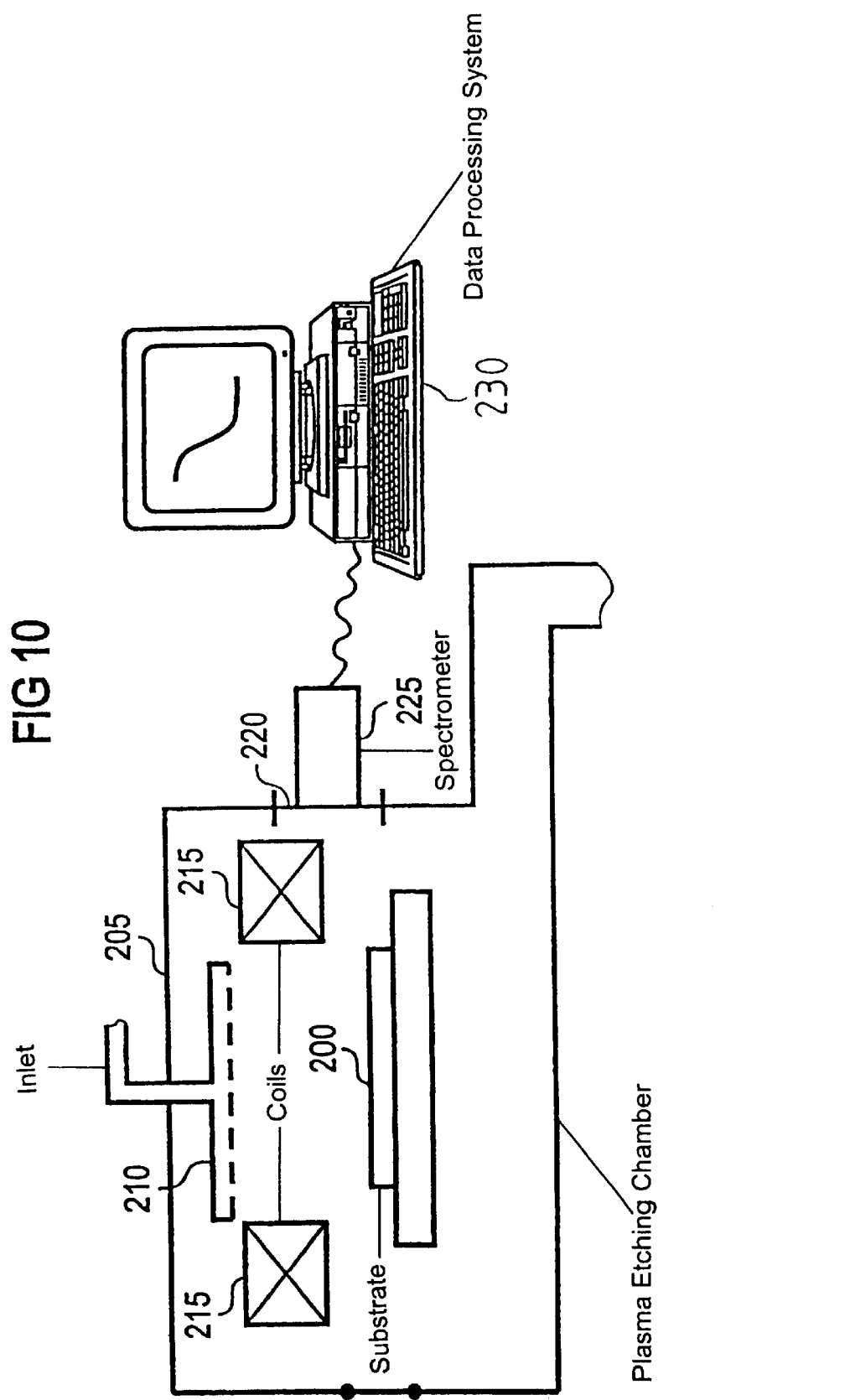

METHOD FOR MONITORING A SEMICONDUCTOR FABRICATION PROCESS FOR PROCESSING A SUBSTRATE

CROSS-REFERENCE TO RELATED APPLICATION

This application is a continuation of copending International Application No. PCT/DE99/02526, filed Aug 12, 1999, which designated the United States.

BACKGROUND OF THE INVENTION

FIELD OF THE INVENTION

The invention lies in the field of semiconductor technology and relates to a method for monitoring a semiconductor fabrication process for processing a substrate.

A multiplicity of fabrication processes are used in fabricating and processing semiconductor substrates to form integrated semiconductor circuits therein. Deposition processes and etching processes for patterning layers that are applied on a substrate are mentioned as examples. These fabrication processes must be monitored, in principle, since, because of their complexity, unnoticed disturbances or poorly adapted process conditions can lead to defectively fabricated semiconductor circuits. To be able to efficiently carry out this monitoring, there is generally a desire to characterize the fabrication process through real-time analysis of specific measurement quantities that are determined during the fabrication process to thereby be able to make a regulating intervention, if appropriate.

Possible methods for monitoring fabrication processes are disclosed, for example, in U.S. Pat. No. 5,877,032, which describes a method for determining the end point of a plasma etching process, in which the detected optical emission of the plasma is used for determining the end point. The background to this approach is the fact that, during etching processes, a layer situated on a substrate is etched through and the underlying substrate is uncovered in the process. The interaction between the etching gas and the uncovered substrate can be demonstrated spectroscopically as a change in the emission spectrum of the plasma. In accordance with U.S. Pat. No. 5,877,032, this change is compared with a multiplicity of predetermined reference curves and the end point of the plasma etching process is inferred from the comparison.

U.S. Pat. No. 5,739,051 likewise discloses a method for determining the end point of a plasma etching process, in which the optical emission of the plasma is likewise used for determining the end point. Emission lines that are characteristic of the interaction between the etching gas and the substrate are used for the assessment.

However, very often it is difficult to extract the measurement quantity that is characteristic of the etching process from the multiplicity of available spectra or else from other measurement quantities. Therefore, U.S. Pat. No. 5,658,423 proposes a method based on so-called principal component analysis, in which the temporal development of the entire emission spectrum from about 240 to 600 nanometers is used for the end point analysis. Using principal component analysis, the volume of data obtained is reduced to a few so-called base patterns and the temporal development thereof is used for detecting the end point. As a result of this, the detection of the end point is no longer based on the assessment of a single emission wavelength, but on the change in the entire available spectrum. In principle, however, this approach also requires that reference values be provided for comparison with the currently measured measurement quantities.

In U.S. Pat. No. 5,737,496, an attempt is made to avoid the last-mentioned problem, in particular, by using a neural network. The neural network is trained using a multiplicity of determined measurement quantities, so that it can subsequently be used for decision-making with regard to the end point identification. It has been shown, however, that neural networks often learn incorrect signals and patterns, so that an incorrect interpretation can occur. Erroneous training of the neural network arises, for example, through a change in the emission spectra because of aging phenomena of the sensors or because of chamber contamination that occurs. Therefore, U.S. Pat. No. 5,864,773 proposes a so-called virtual sensor system, in which these changes are taken into account before the measurement quantities are actually assessed. As a result, the intention is to produce a virtual sensor that is free of chamber-specific or process-specific fault effects. Since it is necessary to have recourse to the operating personnel's experiences in this case, too, unexpectedly occurring faults and changes cannot automatically be taken into account.

SUMMARY OF THE INVENTION

It is accordingly an object of the invention to provide a method for monitoring a semiconductor fabrication process for processing a substrate which overcomes the above-mentioned disadvantages of the prior art methods of this general type.

In particular, it is an object of the invention to provide a method for monitoring a semiconductor fabrication process for processing a substrate which enables the fabrication process to be monitored reliably and in a manner that is, as far as possible, free from faults. Even more particularly, the method serves for determining the end point of the fabrication process.

With the foregoing and other objects in view there is provided, in accordance with the invention, a method for monitoring a plasma process that includes steps of:

using a first model to determine an end point of a first plasma process that is performed in a plasma;

defining the first model with an algorithm, with a termination criterion, and with at least one predetermined measurement quantity that can be determined during the first plasma process and that is based on an intensity of at least one predetermined emission wavelength of the plasma;

configuring the algorithm such that when the algorithm is applied to the predetermined measurement quantity that is determined, the algorithm provides a decision quantity which, upon comparison with the termination criterion, serves for determining the end point of the first plasma process;

performing the first plasma process by using a plasma-excited gas in a plasma chamber, by introducing a substrate, which will be treated, into the plasma chamber, and by allowing the substrate to interact with the plasma-excited gas in the plasma chamber;

during the first plasma process, determining the predetermined measurement quantity for the first model to thereby obtain a measured quantity;

applying the algorithm of the first model to the measured quantity and determining the decision quantity;

comparing the decision quantity with the termination criterion prescribed by the first model and terminating the first plasma process when the termination criterion is met;

using a second model for comparatively determining the end point of the first plasma process;

defining the second model with an algorithm, with a termination criterion, and with at least one predetermined measurement quantity that can be determined during the first plasma process and that is based on an intensity of at least one predetermined emission wavelength of the plasma;

using an additional monitoring function for continuously assessing the first model and the second model;

if the end point that was determined with the second model has a higher significance than the end point that was determined with the first model, then using the second model to determine an end point of a second plasma process succeeding the first plasma process;

measuring intensities of a plurality of emission wavelengths of the plasma during the first plasma process;

using the intensities of the plurality of the emission wavelengths as measurement quantities and continuously storing the measurement quantities in a data processing system;

also using the data processing system for identifying the end point of the first plasma etching process;

performing the first plasma process as a plasma etching process and providing the plasma-excited gas as a dry etching gas that etches at least parts of the substrate;

providing the substrate with an insulating layer; and etching contact holes using the plasma etching process.

In accordance with an added feature of the invention, the method includes: using the second model during the second plasma process; performing the second plasma process in a plasma; using a third model for comparatively determining the end point of the second plasma process; defining the third model with an algorithm, with a termination criterion, and with at least one predetermined measurement quantity that can be determined during the second plasma process and that is based on an intensity of at least one predetermined emission wavelength of the plasma of the second plasma process; and if the end point that was determined with the third model has a higher significance than the end point that was determined with the second model, then using third model for determining an end point of third plasma processes.

In accordance with an additional feature of the invention, the method includes: determining a significance of the end point that was determined with the first model and determining a significance of the end point that was determined with the second model by comparing a temporal development of the measurement quantity based on the predetermined emission wavelength of the first model with a temporal development of the measurement quantity based on the predetermined emission wavelength of the second model.

In accordance with another feature of the invention, the method includes: determining a significance of the end point that was determined with the first model and determining a significance of the end point that was determined with the second model by comparing the decision quantity that was determined by the algorithm of the first model with a decision quantity that is determined by the algorithm of the second model.

In accordance with a further feature of the invention, the method includes: comparing the decision quantity that was determined by the algorithm of the first model with the termination criteria of the first model to obtain a first result; comparing the decision quantity that was determined by the algorithm of the second model with the termination criteria of the second model to obtain a second result; and determining the significance of the end point that was determined with the first model and determining the significance of the end point that was determined with the second model by comparing the first result with the second result.

In accordance with a further added feature of the invention, the method includes: basing the measurement quantity of the first model and the measurement quantity of the second model on a common emission wavelength; and determining a measure of contamination of the plasma chamber by comparing the measurement quantity of the first model and the measurement quantity of the second model.

In accordance with a further additional feature of the invention, the method includes making the insulation layer from silicon oxide.

In accordance with yet an added feature of the invention, the method includes etching the contact holes to have different depths in the insulation layer.

In accordance with yet an additional feature of the invention, the method includes: using a rotating plasma during the first plasma process; and using a rotating plasma during the second plasma process.

In accordance with an added feature of the invention, the method includes obtaining the measured quantity by forming a mean value over a predetermined period of time.

In accordance with an additional feature of the invention, the method includes: using a rotating plasma during the first plasma process; and setting the predetermined period of time to correspond to at least one circulation period of the rotating plasma.

In accordance with another feature of the invention, the method includes: using the algorithm of the first model to determine a position of a local maximum, a local gradient, or a point of inflection of a curve representing a temporal development of the measurement quantity of the first model to thereby yield the decision quantity; and using the algorithm of the second model to determine a position of a local maximum, a local gradient, or a point of inflection of a curve representing a temporal development of the measurement quantity of the second model to thereby yield a decision quantity.

In accordance with a further feature of the invention, the first model differs from the second model at least in terms of the predetermined measurement quantity of the first model or the predetermined algorithm of the first model.

In accordance with a further added feature of the invention, the method includes using stored measurement quantities from preceding fabrication processes for determining a significance of the first model and of the second model.

The invention provides a method for monitoring a fabrication process for processing a substrate in a semiconductor fabrication, which has the steps of:

prescribing a first model for determining the end point of the fabrication process; the first model being defined by an algorithm, by at least one predetermined measurement quantity which can be determined during the fabrication process, and by a termination criterion; the algorithm, when applied to the measurement quantity determined, yields a decision quantity which, upon comparison with the termination criterion, serves for determining the end point of the fabrication process;

carrying out the fabrication process in a chamber suitable for this purpose; and introducing a substrate to be treated into the chamber and processing the substrate in the chamber;

determining the measurement quantity that is predetermined by the first model during the fabrication process;

applying the algorithm of the first model to the measurement quantity that is determined and determining the decision quantity;

comparing the decision quantity with the termination criterion that is prescribed by the first model; and ending the fabrication process when the criterion is met;

using a second model for comparatively determining the end point of the fabrication process; the second model being likewise defined by an algorithm, by at least one predetermined measurement quantity that can be determined during the fabrication process, and by a termination criterion; the second model being used for determining the end point of a further fabrication process that succeeds the fabrication process, provided that the end point is determined by the second model with a higher significance than with the first model.

In the method according to the invention, first a first model is prescribed. In this case, this model is determined, in particular, by an algorithm, by the selection of at least one predetermined measurement quantity that can be determined during the fabrication process, and by a termination criterion. The measurement quantity may be, for example, the intensity of the optical emission of the plasma at a wavelength that is predetermined by the model, the pressure, the temperature and other quantities that can be determined during the fabrication process. The measurement quantity is preferably determined using a sensor that is provided on the chamber and the measurement quantity is fed to a data processing system.

The algorithm prescribed by the model is applied to the measurement quantity that is determined during the fabrication process and in this case yields a decision quantity. The predetermined algorithm is generally assigned a termination criterion that is characteristic of the algorithm, which termination criterion is compared with the determined decision quantity. The end point of the fabrication process is determined from this comparison.

Since the meaningfulness of the measurement quantity or the decision quantity that is determined from the measurement quantity by the algorithm can be impaired because of chamber contaminants, the invention proposes using a second model for comparatively determining the end point of this fabrication process. The second model is likewise defined by an algorithm, by at least one predetermined measurement quantity that can be determined during the fabrication process, and by a termination criterion. The first and second models generally differ at least with regard to the measurement quantity selected or with regard to the algorithm used. However, it is also possible for the second model to use a different measurement quantity and a different algorithm than the first model.

The second model is then likewise used for determining the end point of the fabrication process. The significance of the meaningfulness of the two models are compared with one another. This can be done, for example, by directly comparing the significance of the respective decision quantities of the first and second models with one another. Another possibility is to access the determined measurement quantities with regard to their meaningfulness when the respective algorithms are used. Thus, the intention is, for example, to check whether the measurement quantities are excessively noisy or whether other events occurring during the measurement unfavorably alter the measurement quantities.

If the first and second models differ only with regard to the predetermined measurement quantity, the significance of the two models can be assessed, for example, by directly comparing the two measurement quantities. If the two measurement quantities used represent different emission wavelengths, then it is possible, for example, to use the magnitude of the signal swing when reaching the end point as a measure for determining the significance.

In order to minimize the uncertainties that occur in the prior art in the prediction of the measurement quantities that currently will be measured, according to the invention, first the first model is still used to determine the end point, but the second model is used for a subsequent fabrication process, provided that the second model determines the end point with a higher significance. This enables reliable determination of the end point over many fabrication processes while taking account of changes that occur in the measurement quantities because of chamber contamination, drift of sensors, and also because of changes that stem from different fabrication processes that are carried out in the same chamber. As a result, it is possible, for example, to use the chamber for longer without interim costly cleaning, or to carry out different fabrication processes in one chamber in a targeted manner so that changes because of these different fabrication processes, in part, mutually compensate for one another. This can be observed, for example, when etching processes using different etching gases are carried out in one and the same chamber such that the contamination of one etching process is at least partly removed by the etching gases of the other etching process.

A higher significance in the determination of the end point is manifested e.g. in the decision quantity, upon comparison with the termination criterion, leading to a clearer result than in the case of another model. Another possibility for determining the significance consists in comparing the curve profiles of the measurement quantities of the individual models and assigning a higher significance to that measurement quantity and hence to that assigned model whose curve profile is the most similar to a predetermined mode curve.

However, it is also within the scope of the invention for a plurality of models to be used simultaneously for determining the end point, and for the model with the greatest meaningfulness to be used. One essential advantage of the invention consists in using measurement quantities independently of their correlation with process specifics. Thus, by way of example, in the case of an emission spectrum of a plasma, only a few emission lines are characteristic of the interaction between the etching gas and the substrate. It is customary, therefore, for precisely these lines to be selected for end point determination. If these lines can no longer be used for assessing the end point because of chamber contamination, the chamber has hitherto had to be cleaned. Consequently, the preselected lines could only be used under "good" process conditions.

Using the inventive method, it is now possible to select further emission lines that are not even characteristic or not very characteristic of the interaction between the etching gas and the substrate, provided that they yield a useable and reliable end point signal when the algorithms prescribed by the models are used. Thus, in principle, all measurement quantities are available and can be used for determining the end point. In this case, the individual measurement quantities that are available can be tested during the fabrication process and can be processed with the algorithms in order to ascertain whether a suitable end point signal can be generated from them.

If the second model is used for determining the end point in a subsequent fabrication process, furthermore a third model is used for comparatively determining the end point and the third model is used, if appropriate, provided that it determines the end point with a higher significance.

Preferably, the measurement quantities determined are stored and are thus also available for comparative checking. Using these stored measurement quantities, the individual algorithms of the models can be tested and the decision quantities formed in the process can be compared with regard to their meaningfulness. From this comparison it is then possible to determine in each case the "best" measurement quantity and the "best" model for determining the end point for further fabrication processes.

In contrast to the previously known methods, the inventive method thus contains an additional monitoring function that serves for assessing the models. This ensures that a reliable model for end point identification is always provided for the respective fabrication process. This model takes account of the fabrication-specific changes that have occurred previously. As a result, therefore, by selecting the respectively suitable model, despite the occurrence of chamber contamination and other generally undesirable changes, the end point of the fabrication process is determined reliably and with the smallest possible fluctuations. The uncertainties that usually occur in comparing measurement quantities with fixedly predetermined reference values are precluded to the greatest possible extent when using the inventive method.

Suitable algorithms for determining the decision quantity from the measurement quantities determined are, for example, the determination of a local maximum, the local or temporal gradient or the point of inflection of the temporal development of the measurement quantity. The measurement quantities can be stored, for example, in a manner dependent on their temporal development and are thus available for the testing of the algorithms.

However, it is also possible to use a multiplicity of measurement quantities and to apply the algorithm to them. If appropriate, data reduction is effected at the same time. If the measurement quantities represent the emission spectrum of a plasma in a predetermined wavelength range, the so-called principal component analysis can also be used as an algorithm. The analysis determines base patterns representing the spectrum and also the temporal development thereof. In particular the temporal development of individual base patterns can be used as a decision quantity.

The invention furthermore proposes a method for monitoring a plasma process for processing a substrate in semiconductor fabrication having the steps of:

using a first model for determining the end point of the plasma process; the first model being defined by an algorithm, by at least one predetermined measurement quantity that can be determined during the plasma process and that is based on the intensity of at least one predetermined emission wavelength of the plasma, and by a termination criterion; the algorithm, when applied to the measurement quantity determined, yields a decision quantity which, upon comparison with the termination criterion, serves for determining the end point of the plasma process;

carrying out the plasma process using a plasma-excited gas in a plasma chamber; a substrate to be treated is introduced into the plasma chamber and interacts there with the plasma-excited gas;

determining the measurement quantity predetermined by the first model during the plasma process;

applying the algorithm of the first model to the measurement quantity determined, and determining the decision quantity;

comparing the decision quantity with the termination criterion prescribed by the first model; the plasma process being terminated when the termination criterion is met;

using a second model for comparatively determining the end point of the plasma process, which is likewise defined by an algorithm, by at least one predetermined measurement quantity that can be determined during the plasma process and that is based on the intensity of at least one predetermined emission wavelength of the plasma, and by a termination criterion; the second model being used for determining the end point of a further plasma process succeeding the plasma process, provided that the end point was determined by the second model with higher significance than with the first model.

In plasma processes, in particular, there is a need to reliably determine the end point since undesirable incipient etching of the substrate can otherwise occur. This arises, for example, in so-called plasma etching processes in which a plasma-excited gas (dry etching gas) interacts with the substrate. The substrate is usually covered with a masking layer (photomask), so that only the uncovered regions of the substrate come into contact with the dry etching gas and the substrate is actually only etched there. However, layers located deeper in the substrate should not be attacked by the dry etching gas, so that the etching process must be stopped when the substrate is etched through and the layers are reached.

A suitable measurement quantity in plasma etching processes is, in particular, the emission spectrum of the plasma, since a multiplicity of emission wavelengths are available here.

The inventive method is preferably used when etching contact holes into an insulation layer that is situated on the substrate. In this case, the insulation layer is preferably composed of silicon oxide. In the course of etching contact holes in the insulation layer, it is possible at the same time, or else afterward, to produce further structures in the insulation layer, which are finally filled with a conductive material, for example. It is thus possible to fabricate e.g. wiring planes in an integrated semiconductor circuit using so-called demasking technology.

Other features which are considered as characteristic for the invention are set forth in the appended claims.

Although the invention is illustrated and described herein as embodied in a method for monitoring a fabrication process for processing a substrate in semiconductor fabrication, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows individual method steps for determining the end point of a plasma process;

FIG. 2 shows the selection of a suitable model for determining the end point;

FIG. 9 shows the fluctuations of determined end points in comparison with the fluctuations in the case of a fixedly predetermined model; and FIG. 10 shows a plasma etching chamber for carrying out the inventive method.

DESCRIPTION OF THE PREFERRED EMBODIMENTS

Figure 3A:
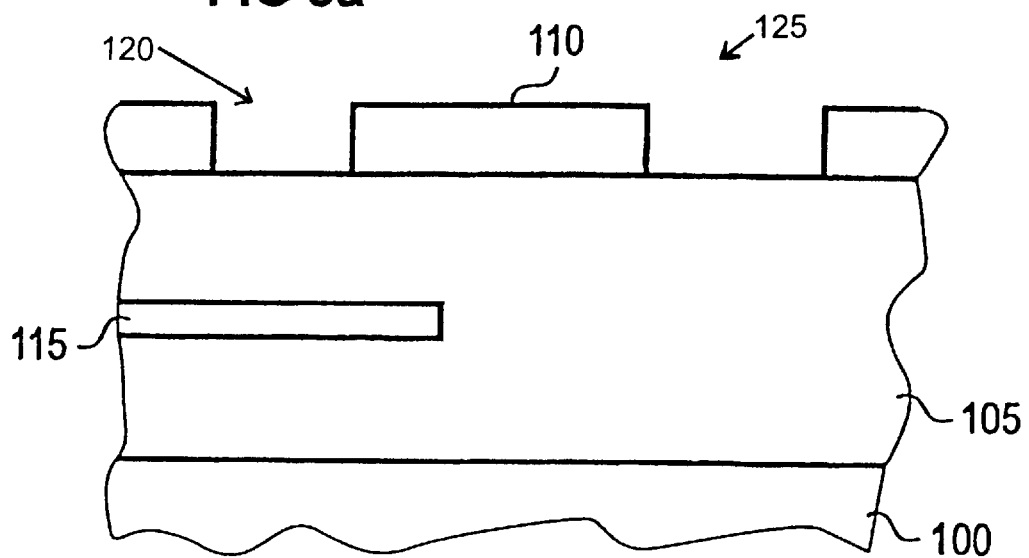
FIGS. 3a and 3b show an insulation layer on a substrate with contact holes of different depths that will be introduced therein.

Referring now to the figures of the drawing in detail and first, particularly, to FIG. 1 thereof, there is shown the basic sequence of the inventive method. First, a substrate that will be processed is introduced into a plasma chamber. This plasma chamber usually has a substrate carrier and devices for generating the plasma are arranged above this substrate carrier. After introducing the substrate in the plasma chamber, the plasma is ignited in the plasma chamber and the reaction gases used are introduced. Using a sensor, for example, a multichannel spectrometer, the emission of the plasma is then continuously detected in a selected wavelength range, lying between 200 and 900 nm for example. In this case, a sampling rate of a different magnitude is chosen depending on the expected changes. To limit the volume of the data obtained, it is expedient, for example, to choose a sampling rate of 1 per second.

From the multiplicity of intensities determined, after the first model has been prescribed, an intensity at a predetermined wavelength is selected and is used as the measurement quantity. In parallel with this, for comparatively assessing the plasma process, it is possible to use a second model that is associated with a different emission wavelength that is used as the measurement quantity. Thus, in the present case, the intensity of the optical emission is measured at two different wavelengths and the measurement quantity of the respective models is determined from these.

The two models can be compared by directly comparing the respective measurement quantities. A possible decision criterion here is e.g. the magnitude of the signal swing or the degree of relative change of the measurement quantities. The decision quantity is subsequently formed from the determined measurement quantities by applying the respectively predetermined algorithm. By way of example, the algorithm can include the determination of the local maxima of the temporal development of the measurement quantity, the formation of the derivative, and the determination of the point of inflection. The decision quantities determined differ depending on the algorithm used. If the algorithm that is used determines the local maxima, the decision quantity specifies e.g. the position and the size of the local maximum. When a derivative algorithm is used, the magnitude of the temporal gradient of the measurement quantity, i.e. the degree to which it changes, is determined.

However, decision quantities based on different algorithms can be compared with one another only to a limited extent, so that a statement with regard to the significance of the end point identification can only be obtained by directly comparing the decision quantity with its assigned termination criterion. If the termination criterion demands e.g. a minimum height and a minimum width of the local maximum, then the significance of this end point identification can be specified, for example, by specifying the relative height of the local maximum with respect to the minimum height.

In contrast to using the local maximum, when using the temporal gradient of the measurement quantity, the termination criterion can demand that the temporal gradient have a minimum value over a predetermined period of time. Here, too, this requirement serves for preventing incorrect interpretations.

At the same time, by comparing the decision quantity with the termination criterion, it is possible to determine the extent to which the result obtained is significant. This may be manifested, for example, in a direct comparison of the decision quantity with the threshold value that is prescribed by the termination criterion (for example, the magnitude of the local gradient). Therefore, it is possible for the significance of the statement that is determined with the respective model to be directly compared with one another with regard to the end point. Even if this comparison does not necessarily lead to using the model with the highest significance in the present plasma process, the statement can nonetheless be used to state which model will be used in a subsequent plasma process. In the present exemplary embodiment, the first model is still used in the plasma process, even if the second model has determined the end point with a higher significance. However, in a subsequent plasma process, the second model is then used for determining the end point.

An advantage of this approach is the determination of the end point with little fluctuation, so that the etching processes can be effected essentially with the same time duration. However, if longer etching times result because of contamination, they are taken into account by the second model since the second model is associated with, for example, a different emission wavelength in which the changes are manifested in a manner such that they can be registered.

The model selection will be consolidated below using FIG. 2. In principle, it is possible to prescribe more than just two models for end point determination. It is expedient first to use a single model for the end point identification of the respective current plasma process. The other models are then used for comparatively determining the end point. In this case, it is also possible to use data records of previous plasma processes for model assessment, in order thus to find out which model is the most robust with respect to process changes. The model assessment can either be effected in parallel with the end point identification of the first model or can follow after the end of the plasma process. Consequently, the invention provides, in addition to monitoring the plasma process and determining the end point, a further monitoring to the effect that the models used for end point determination are continuously tested with regard to their suitability. This ensures that work is always effected with reliable models.

Figure 3B:
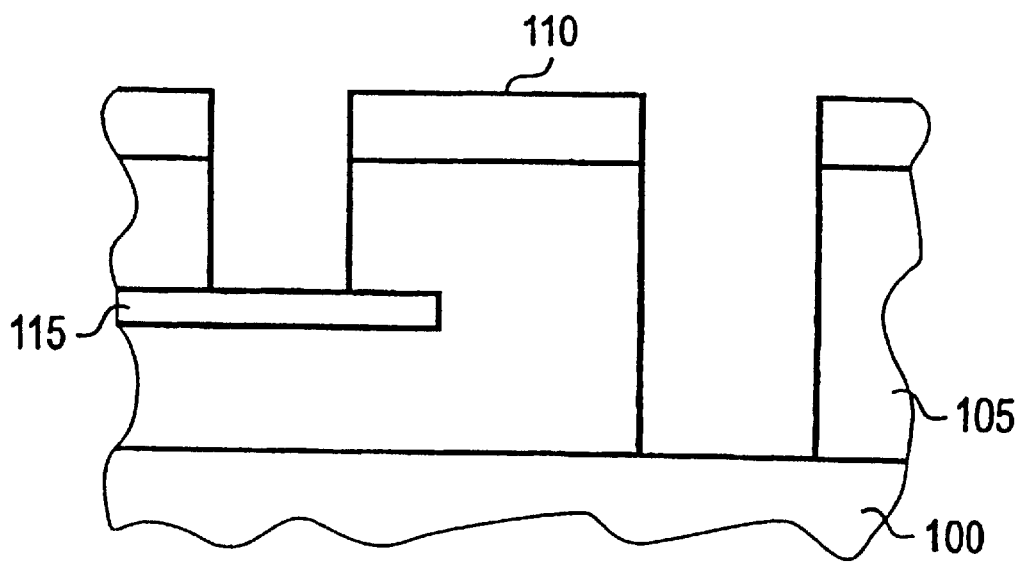

The invention will be consolidated below using a concrete exemplary embodiment. To that end, reference is made to FIGS. 3a and 3b, which show a semiconductor substrate 100 on which a silicon oxide layer 105 is situated. Together these form the substrate to be processed. A further layer 115, which represents a conductive structure, for example, is buried in the silicon oxide layer 105. This conductive structure may be an interconnect of a metallization plane.

In order to define contact holes, an etching mask 110 is applied to the silicon oxide layer 105. In this case, there is a first opening 120 in the etching mask 110 above the further layer 115, whereas a second opening 125 is laterally offset with respect to the further layer 115.

The substrate prepared in this way is transferred into a plasma etching chamber and is exposed to a plasma-excited, fluorine-containing etching gas. An etching gas mixture including $CF_4$, $CHF_3$ and argon is used as the etching gas, and the homogeneity of the plasma is improved by a magnetic field of about 60 gauss. The plasma itself is generated and maintained by a capacitively applied RF voltage (AC). The power used for this purpose is about 1000 watts. The pressure in the plasma etching chamber is about 150 mtorr, the flows, specified in sscm, being about 170 for argon, about 18 for $CF_4$ and about 85 for $CHF_3$. The etching process was carried out on a so-called MxP+ etching installation from Applied Materials™. There was fitted to the latter, at a window, a multichannel spectrometer from Hamamatsu™ bearing the type designation C7460 for detecting the optical emission of the plasma. The spectrometer has 1024 channels distributed uniformly between a wavelength range from 200 to 950 nm. A maximum sampling rate of 50 per second can be achieved with the spectrometer used.

The spectrometer is connected to a data processing system that continuously records, evaluates and stores the registered spectra. Furthermore, the data processing system is also used for identifying the end point of the plasma etching process. The basic construction of such an etching chamber in conjunction with the spectrometer and the data processing system is shown in FIG. 10. The substrate 200 is situated in the plasma etching chamber 205, below an etching gas inlet device 210. Coils 215 are situated laterally with respect to the etching gas inlet device 210. These coils 215 are for homogenizing the plasma and are arranged in rotary fashion, if appropriate. The magnetic field rotation made possible as a result improves the homogenization of the plasma. The multichannel spectrometer 225 is arranged on the outer wall of the plasma etching chamber 205 in the region of a window 220. The multichannel spectrometer 225 is linked to a data processing system 230 via a data line. Using the etching gas described above, contact holes are subsequently etched into the silicon oxide layer 105. These contact holes reach as far as the further layer 115 in the region of the first opening 120 of the etching mask 110 and as far as the semiconductor substrate 100 in the region of the second opening 125 of the etching mask 110. Two contact holes of different depth are thus produced. Monitoring the plasma etching process as described below serves, in particular, for identifying when the silicon oxide layer 105 is completely etched through so that the etching process can then be terminated.

Figure 4:
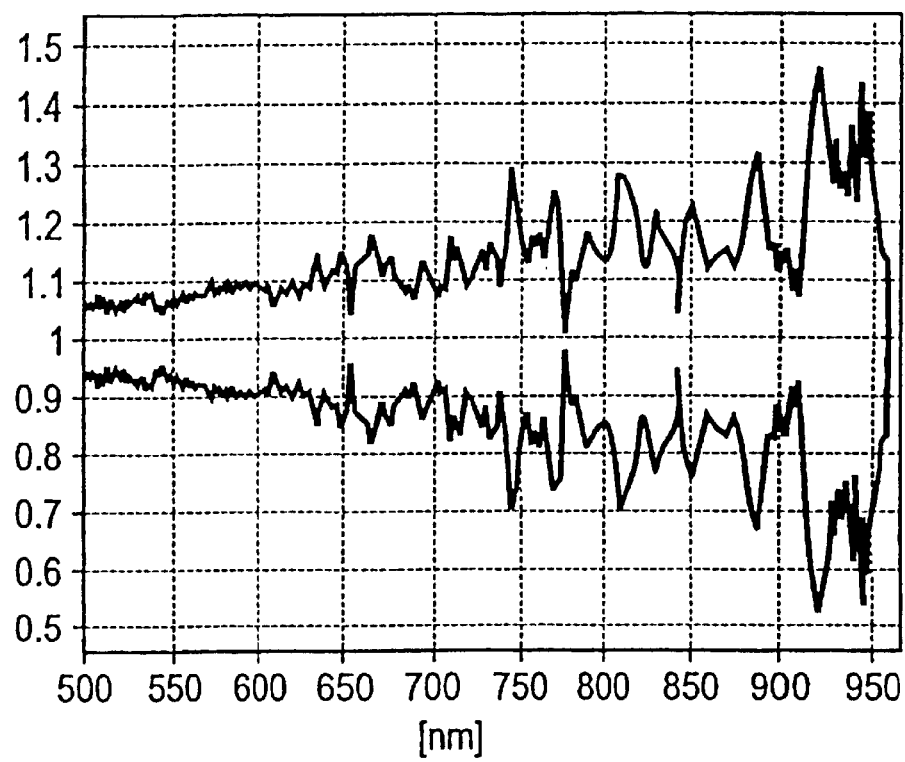
FIG. 4 shows the normalized spectrum of an oxide etching process at different points in time.
Figure 5:
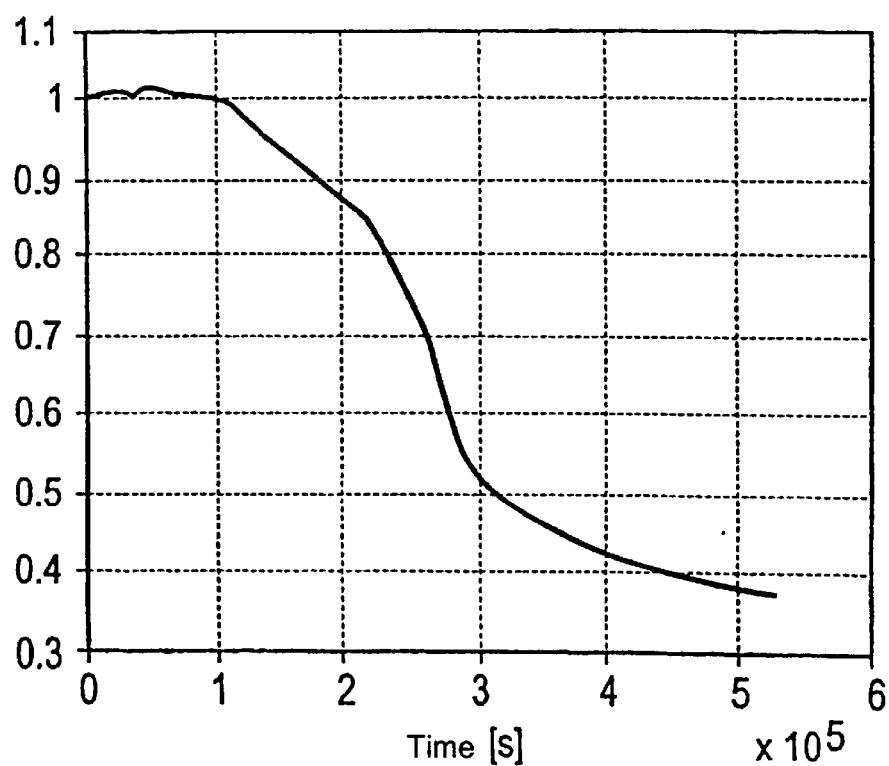
FIG. 5 shows the temporal profile of an emission line of the oxide etching process.

At least one of the 1024 available emission wavelengths is selected for monitoring the plasma etching process. In FIG. 4, for that purpose the spectrum between 500 and 950 nm during a so-called oxide PAD etching is shown and the relative normalized intensity changes of the wavelengths between the main etch (layer 105 shown in FIG. 3) and the over etch (after removal of the layer 105) are plotted. The "upper" curve corresponds to the normalization with regard to the main etch curve and the "lower" one with regard to the over etch curve. These are identical, except for the sign, in the case of patterning without topology (i.e. the etching depth is the same at all points on the substrate). The y-axis shows the percentage change in the wavelength intensities between the main etch and the over etch. FIG. 4 illustrates that the maximum change for this process is at 918 nm. The profile of this wavelength (918 nm) is illustrated in FIG. 5. This example demonstrates how the "best" wavelength can be found by comparing the main etch and the over etch curves.

The over etch is usually understood to be a prolongation of the determined etching time (main etch, i.e. the time for etching through the silicon oxide layer) in order to compensate for possible fluctuations in the etching rate over the substrate.

It can clearly be seen in FIG. 4 that a maximum change in the signal swing is recorded at about 918 nm.

The temporal profile of the emission wavelength at 918 nm is illustrated in FIG. 5. Here, too, it can be seen that a great fall in the intensity occurs, which can be used for detecting the end point.

Figure 6:
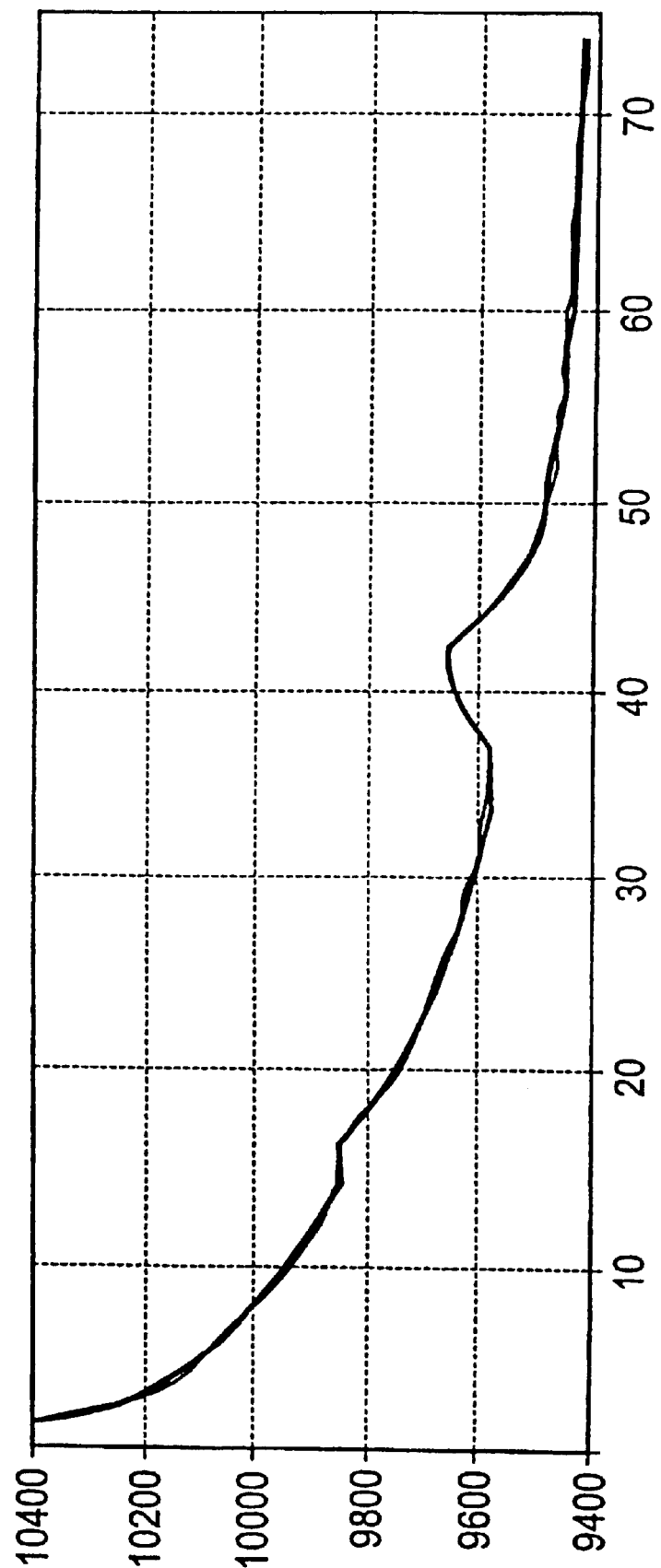
FIG. 6 shows a selected emission line of the oxide etching process that can be used for determining the end point.

However, a different line, namely the so-called CN line at 378 nm, was used for end point identification during the etching of the contact hole in the silicon oxide layer 105. This line is shown in FIG. 6. Two local maxima are clearly discernible. The first maximum is associated with the shallower contact hole and the second maximum is associated with the deeper contact hole in the silicon oxide layer 105. The maxima, i.e. the change in the intensity of the CN line, can be attributed to an interaction between the etching gas and the respectively uncovered materials that are situated at the bottom of the contact holes. The end point of the plasma etching process can be determined in particular from the position of the second maximum. Preferably, after the end point has been reached, the etching process is additionally continued by a fixedly predetermined time (over etch) in order to compensate for fluctuations in the local etching rate. These fluctuations are manifested, for example, in relatively wide and flat maxima. The above-mentioned fluctuations arise, for example, as a result of a locally varying thickness of the silicon oxide layer 105 or as a result of non-uniform distribution and feeding of the etching gas. It can thus happen that the etching advances more quickly in the central region of the substrate than in the edge region. These fluctuations mean that the interaction between the etching gas and the uncovered material occurs at different points in time and thus leads to a relatively weakly pronounced maximum. In order, however, to ensure that the silicon oxide layer is reliably etched through in all of the contact holes that are being formed, after the detection of the maximum, the plasma etching process is continued for the predetermined time duration. The predetermined time duration is preferably determined in a manner dependent on the width of the local maximum.

Accordingly, in the present exemplary embodiment, the determination of the position of the second maximum serves for determining the end point. To that end, an algorithm that determines the position of local maxima is applied to the measured intensity of the emission at 387 nm. This algorithm yields the position and the width of the determined maxima as a decision quantity. These details are compared with a termination criterion that demands a minimum height and a minimum width of the local maxima. This is intended to prevent fluctuations in the determination of the measurement quantity, which can likewise be manifested in local maxima, from leading to an incorrect interpretation. The termination criterion can be defined e.g. such that the height and width of the local maxima correspond to at least twice the height and width of the fluctuations that are expected. If appropriate, the measured intensity can also be subjected to mean value formation to reduce the fluctuations.

The selection of the emission line at 387 nm, the algorithm for determining the local maximum and the predetermined termination criterion together form the first model. Further models are tested in parallel with the identification of the end point by the first model. The further models differ from the model used either with regard to the selection of the emission line used used or with regard to the algorithm used. The models, i.e. the significance of the identification of the end point, are continuously compared with one another in order to select the best model in each case for subsequent etching processes. In the present exemplary embodiment, the significance of the model can be determined, for example, by calculating the relative difference between the height of the determined maximum and the height prescribed by the termination criterion.

Figure 7:
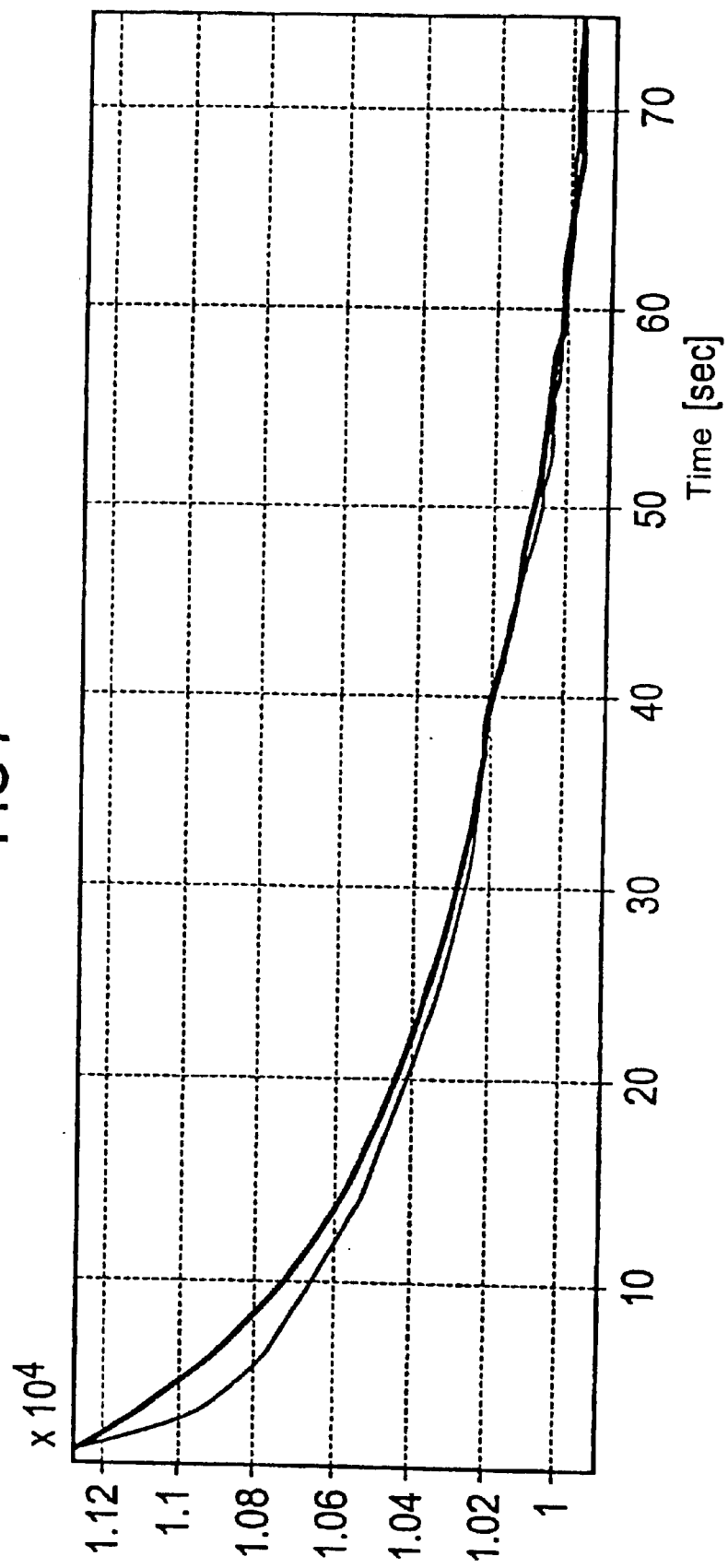
FIG. 7 shows a changed emission line because of chamber contaminants.
Figure 8:
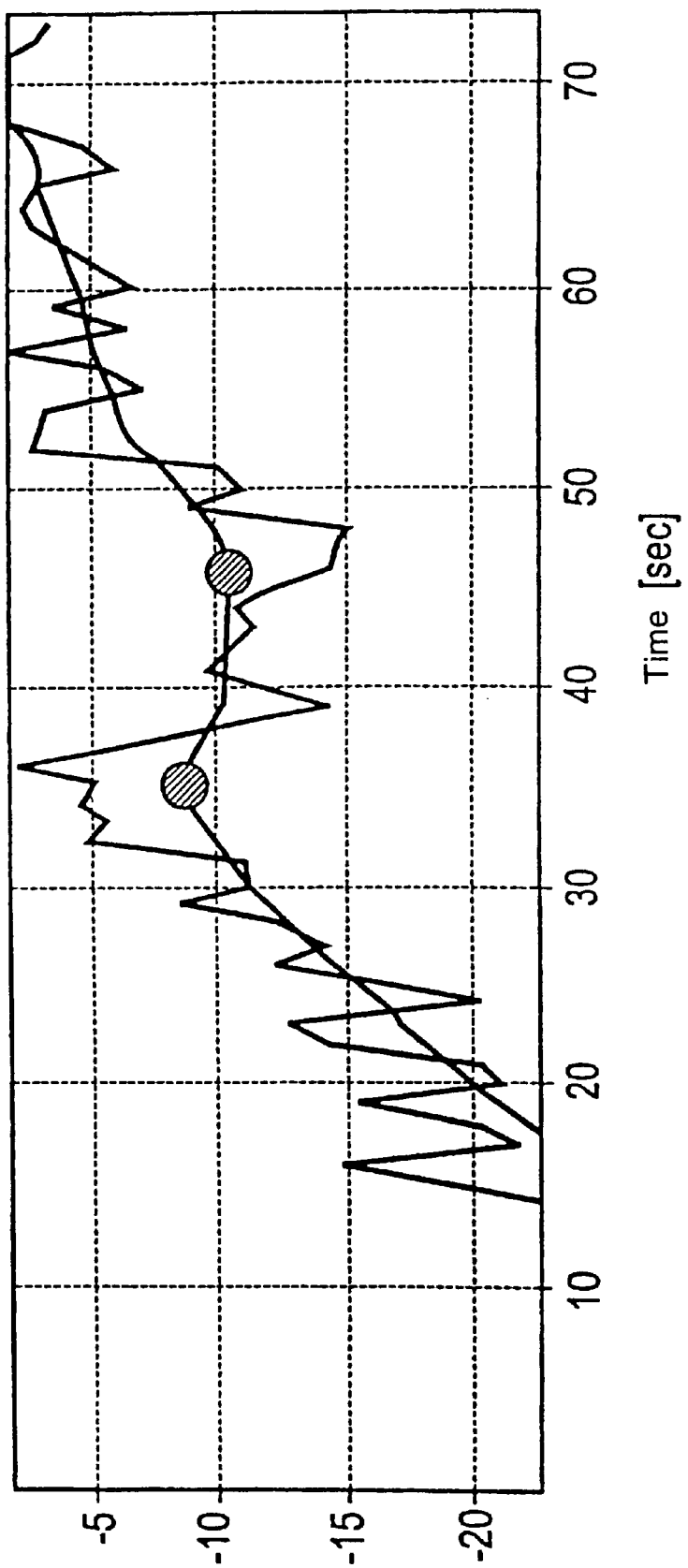
FIG. 8 shows the determination of the end point from the changed emission line by using another algorithm.

Contamination of the chamber or of the window at which the spectrometer is arranged can result in a change in the measured pattern of the intensity at the predetermined emission wavelength. This is illustrated in FIG. 7, which likewise shows the CN line at 387 nm, but after a multiplicity of plasma etching processes. In the meantime, the local maxima are no longer discernible for this line. Using the first model, which works with the algorithm for identifying the local maxima, would therefore no longer enable identification of the end point. For this reason, it is necessary to change the model. Since further models have already been tested, during previous plasma etching processes, with regard to their suitability for end point identification, it is now possible to have recourse to a further model that works at the same wavelength, but with a different algorithm. In the present case, the points of inflection of the curve illustrated in FIG. 7 are determined for that purpose, their position serving as a measure of the identification of the end point. To that end, the derivative of the curve is calculated. This is illustrated in an unsmoothed and in a smoothed form in FIG. 8. From the smoothed curve, in particular, a suitable end point signal can be generated either by using a further derivative or by using an algorithm for determining local maxima. It is known from the previous comparative assessments of this model with the model originally employed that the local minimum of the smoothed curve illustrated in FIG. 8 is good for determining the position of the end point. This minimum is therefore used for detecting the end point.

An essential advantage of the inventive method is that the end points are determined with relatively small fluctuations despite changed process conditions. This is illustrated in FIG. 9, in which the open boxes denote the fluctuation range of the end points determined with a fixedly prescribed model. In this case, 80% of the end points determined lie within the open boxes. The diamond specifies the mean value. The maximum fluctuations are identified by error bars. In this case, the boxes each represent at least one batch.

In contrast thereto, significantly less fluctuation in the end point identification can be expected by continuously adapting the model for end point identification. This can be seen from the filled boxes, in which, on the one hand, the mean values are relatively constant, and on the other hand, the fluctuations have only a relatively small value. Moreover, it is evident that the actual end points are generally distinctly earlier than those that are determined with the fixedly prescribed model. In this case, the graphical derivative of the curve profile of a predetermined emission wavelength was used as the fixedly prescribed model.

The algorithms of the models that are used according to the invention can be classified into at least two categories. In the first category, threshold-value analysis of the curve profile of emission wavelengths is carried out, e.g. testing for absolute or relative changes in the expected end point interval is effected or the curve profile is compared with a predetermined model profile. A distance dimension, which represents the decision quantity, can then be determined from the comparison. If this distance dimension exceeds a threshold value that is predetermined by the termination criterion, the end point is deemed to be identified. It goes without saying that it is also possible to compare the currently determined measurement curve with a plurality of model profiles to be able to combat a drift in the measurement curve. The end point is then determined when the measurement curve that is currently being measured reaches a predetermined section in the model profile associated with it. Equally, graphical derivatives can be associated with the threshold-value analysis. By contrast, threshold-value-free analyses form the second category, is characterized, for example, by the identification of zero crossings, maxima, and points of inflection.

I claim:

1. A method for monitoring a plasma process, which comprises:

using a first model to determine an end point of a first plasma process that is performed in a plasma;

defining the first model with an algorithm, with a termination criterion, and with at least one predetermined measurement quantity that can be determined during the first plasma process and that is based on an intensity of at least one predetermined emission wavelength of the plasma;

configuring the algorithm such that when the algorithm is applied to the predetermined measurement quantity that is determined, the algorithm provides a decision quantity which, upon comparison with the termination criterion, serves for determining the end point of the first plasma process;

performing the first plasma process by using a plasma-excited gas in a plasma chamber, by introducing a substrate, which will be treated, into the plasma chamber, and by allowing the substrate to interact with the plasma-excited gas in the plasma chamber;

during the first plasma process, determining the predetermined measurement quantity for the first model to thereby obtain a measured quantity;

applying the algorithm of the first model to the measured quantity and determining the decision quantity;

comparing the decision quantity with the termination criterion prescribed by the first model and terminating the first plasma process when the termination criterion is met;

using a second model for comparatively determining the end point of the first plasma process;

defining the second model with an algorithm, with a termination criterion, and with at least one predetermined measurement quantity that can be determined during the first plasma process and that is based on an intensity of at least one predetermined emission wavelength of the plasma;

using an additional monitoring function for continuously assessing the first model and the second model;

if the end point that was determined with the second model has a higher significance than the end point that was determined with the first model, then using the second model to determine an end point of a second plasma process succeeding the first plasma process;

measuring intensities of a plurality of emission wavelengths of the plasma during the first plasma process;

using the intensities of the plurality of the emission wavelengths as measurement quantities and continuously storing the measurement quantities in a data processing system;

also using the data processing system for identifying the end point of the first plasma etching process;

performing the first plasma process as a plasma etching process and providing the plasma-excited gas as a dry etching gas that etches at least parts of the substrate;

providing the substrate with an insulating layer; and etching contact holes using the plasma etching process.

2. The method according to claim 1, which comprises:

using the second model during the second plasma process;

performing the second plasma process in a plasma;

using a third model for comparatively determining the end point of the second plasma process;

defining the third model with an algorithm, with a termination criterion, and with at least one predetermined measurement quantity that can be determined during the second plasma process and that is based on an intensity of at least one predetermined emission wavelength of the plasma of the second plasma process; and if the end point that was determined with the third model has a higher significance than the end point that was determined with the second model, then using the third model for determining an end point of third plasma processes.

3. The method according to claim 1, which comprises:

determining a significance of the end point that was determined with the first model and determining a significance of the end point that was determined with the second model by comparing a temporal development of the measurement quantity based on the predetermined emission wavelength of the first model with a temporal development of the measurement quantity based on the predetermined emission wavelength of the second model.

4. The method according to claim 1, which comprises:

determining a significance of the end point that was determined with the first model and determining a significance of the end point that was determined with the second model by comparing the decision quantity that was determined by the algorithm of the first model with a decision quantity that is determined by the algorithm of the second model.

5. The method according to claim 4, which comprises:

comparing the decision quantity that was determined by the algorithm of the first model with the termination criteria of the first model to obtain a first result;

comparing the decision quantity that was determined by the algorithm of the second model with the termination criteria of the second model to obtain a second result; and determining the significance of the end point that was determined with the first model and determining the significance of the end point that was determined with the second model by comparing the first result with the second result.

6. The method according to claim 1, which comprises:

basing the measurement quantity of the first model and the measurement quantity of the second model on a common emission wavelength; and determining a measure of contamination of the plasma chamber by comparing the measurement quantity of the first model and the measurement quantity of the second model.

7. The method according to claim 1, which comprises: making the insulation layer from silicon oxide.

8. The method according to claim 1 which comprises: etching the contact holes to have different depths in the insulation layer.

9. The method according to claim 1, which comprises: using a rotating plasma during the first plasma process.

10. The method according to claim 9, which comprises: using a rotating plasma during the second plasma process.

11. The method according to claim 1, which comprises:

obtaining the measured quantity by forming a mean value over a predetermined period of time.

12. The method according to claim 11, which comprises:

using a rotating plasma during the first plasma process; and setting the predetermined period of time to correspond to at least one circulation period of the rotating plasma.

13. The method according to claim 1, which comprises:

using the algorithm of the first model to determine a feature selected from the group consisting of a position of a local maximum, a local gradient, and a point of inflection of a curve representing a temporal development of the measurement quantity of the first model to thereby yield the decision quantity; and using the algorithm of the second model to determine a feature selected from the group consisting of a position of a local maximum, a local gradient, and a point of inflection of a curve representing a temporal development of the measurement quantity of the second model to thereby yield a decision quantity.

14. The method according to claim 1, wherein the first model differs from the second model at least in terms of a feature selected from the group consisting of the predetermined measurement quantity of the first model and the predetermined algorithm of the first model.

15. The method according to claim 1, which comprises: using stored measurement quantities from preceding fabrication processes for determining a significance of the first model and of the second model.

* * * * *